United States Patent
Sun et al.

(10) Patent No.: US 6,730,610 B1
(45) Date of Patent: May 4, 2004

(54) MULTIPLE THICKNESS HARD MASK METHOD FOR OPTIMIZING LATERALLY ADJACENT PATTERNED LAYER LINEWIDTHS

(75) Inventors: Ming-Jyh Sun, Tainan (TW);
Shean-Ren Horng, Tainan (TW);
Chi-Shen Loa, Tainan (TW); Yens Ho, Kaoshiung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/326,502

(22) Filed: Dec. 20, 2002

(51) Int. Cl.[7] ............ H01L 21/302; H01L 21/461
(52) U.S. Cl. ............ 438/706; 438/710; 438/713
(58) Field of Search .................. 438/706, 710, 438/700, 713, 780, 202

(56) References Cited

U.S. PATENT DOCUMENTS

| | | | |
|---|---|---|---|
| 5,567,642 A | | 10/1996 | Kim et al. |
| 5,723,893 A | | 3/1998 | Yu et al. |
| 5,773,199 A | * | 6/1998 | Linliu et al. ............ 438/706 |
| 5,837,428 A | * | 11/1998 | Huang et al. ............ 430/313 |
| 5,877,535 A | | 3/1999 | Matsumoto |
| 5,962,195 A | * | 10/1999 | Yen et al. ............ 438/713 |
| 5,981,398 A | * | 11/1999 | Tsai et al. ............ 438/710 |
| 6,255,232 B1 | * | 7/2001 | Chang et al. ............ 438/780 |
| 6,284,581 B1 | * | 9/2001 | Pan et al. ............ 438/202 |
| 6,518,191 B2 | * | 2/2003 | Nakagawa ............ 438/710 |
| 6,569,605 B1 | * | 5/2003 | Bae ............ 430/316 |
| 6,605,541 B1 | * | 8/2003 | Yu ............ 438/700 |

\* cited by examiner

Primary Examiner—John F. Niebling
(74) Attorney, Agent, or Firm—Tung & Associates

(57) ABSTRACT

A method for fabricating a pair of patterned target layers within a microelectronic product employs a pair of patterned etch mask layers of different thicknesses. The pair of patterned etch mask layers of different thicknesses provides that the pair of patterned target layers may be formed with individual linewidth control, absent fabrication or modification of a photomask to realize the same result. The method is particularly useful for fabricating pair of gate electrodes for use within CMOS devices.

20 Claims, 2 Drawing Sheets

MULTIPLE THICKNESS HARD MASK METHOD FOR OPTIMIZING LATERALLY ADJACENT PATTERNED LAYER LINEWIDTHS

BACKGROUND OF THE INVENTION

1. Field of the Invention

The present invention relates generally to methods for fabricating microelectronic products. More particularly, the present invention relates to linewidth control methods when forming patterned layers within microelectronic products.

2. Description of the Related Art

Common in the art of semiconductor product fabrication is the use of complementary metal oxide semiconductor (CMOS) devices formed within and upon semiconductor substrates. CMOS devices, such as CMOS field effect transistor (FET) devices, are generally of interest within semiconductor products insofar as CMOS devices may often be readily fabricated to provide low power consumption circuits within semiconductor products.

While CMOS devices are thus clearly desirable and often essential in the art of semiconductor product fabrication, CMOS devices are nonetheless not entirely without problems.

In that regard, it is often difficult in the art of semiconductor product fabrication to fabricate CMOS devices with optimized performance insofar as CMOS devices are complementary paired devices whose operating characteristics are not necessarily coincidently optimized.

It is thus towards the goal of fabricating CMOS devices with enhanced performance that the present invention is directed.

Various CMOS devices having desirable properties, and methods for fabrication thereof, have been disclosed in the art of semiconductor product fabrication.

Included but not limiting among the CMOS devices and methods are CMOS devices and methods disclosed within: (1) Kim et al., in U.S. Pat. No. 5,567,642 (a method for fabricating a CMOS device which provides a pair of field effect transistor devices with a pair of gate electrodes of differing compositions); (2) Yu et al., in U.S. Pat. No. 7,723,893 (a gate electrode with multiple silicide layers for use within a CMOS device); and (3) Matsumoto, in U.S. Pat. No. 5,877,535 (an additional method for fabricating a CMOS device which provides a pair of field effect transistor devices with a pair of gate electrodes of differing compositions).

Desirable in the art of semiconductor product fabrication are additional methods for fabricating CMOS devices with optimized performance.

It is towards the foregoing object that the present invention is directed.

SUMMARY OF THE INVENTION

A first object of the present invention is to provide a method for fabricating a CMOS device.

A second object of the present invention is to provide a method in accord with the first object of the invention, wherein the CMOS device is fabricated with optimized performance.

In accord with the objects of the present invention, the present invention provides a method for forming a pair of patterned layers within a microelectronic product.

To practice the method of the invention, there is first provided a substrate having a first region laterally adjacent a second region. There is then formed over the substrate a uniform thickness blanket target layer which covers the first region and the second region. There is then formed over the uniform thickness blanket target layer a first patterned etch mask layer having a first thickness over the first region and a second patterned etch mask layer having a second thickness different from the first thickness over the second region. Finally, there is then etched the blanket target layer to form a first patterned target layer over the first region and a second patterned target layer over the second region. Within the invention, the first thickness and the second thickness are adjusted such as to optimize a first linewidth of the first patterned target layer and a second linewidth of the second patterned target layer.

The invention is particularly applicable to forming a pair of gate electrodes within a pair of field effect transistor devices within a CMOS device.

The invention provides a method for fabricating a CMOS device, wherein the CMOS device is fabricated with optimized performance.

The invention realizes the foregoing object by employing when fabricating a pair of patterned target layers, which may be a pair of gate electrodes within a pair of field effect transistor devices within a CMOS device, a pair of etch mask layers of different thicknesses such that the pair of patterned target layers when etched from a blanket target layer may be formed with different and optimized linewidths absent fabrication or modification of a photomask to realize the same result.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for fabricating a CMOS device, wherein the CMOS device is fabricated with optimized performance.

The invention realizes the foregoing object by employing when fabricating a pair of patterned target layers, which may be a pair of gate electrodes within a pair of field effect transistor devices within a CMOS device, a pair of etch mask layers of different thicknesses such that the pair of patterned target layers when etched from a blanket target layer may be formed with different and optimized linewidths absent fabrication or modification of a photomask to realize the same result.

While the present invention provides particular value within the context of fabricating CMOS devices, the present invention is not intended to be so limited. Thus, FIG. 1 and FIG. 2 show a pair of schematic cross-sectional diagrams illustrating the results of progressive stages of fabricating a microelectronic product in accord with a general embodiment of the invention.

Figure 1:
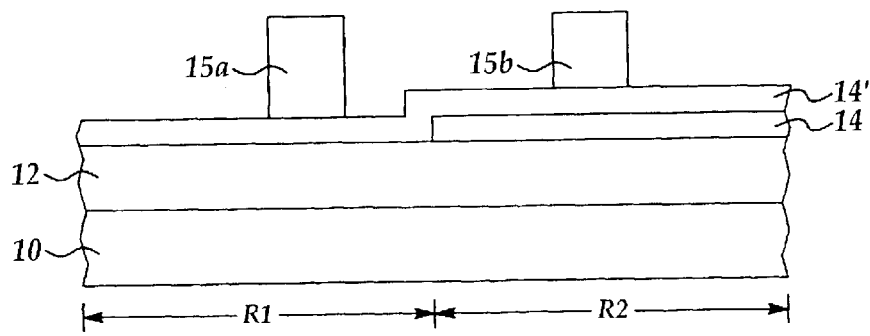
FIG. 1 and FIG. 2 show a pair of schematic cross-sectional diagrams illustrating the results of progressive stages of fabricating a microelectronic product in accord with a general embodiment of the invention.
Figure 2:
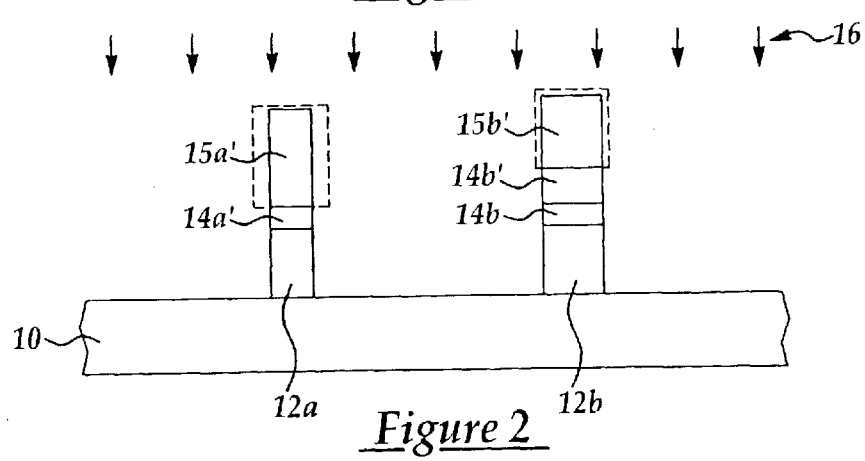

Shown in FIG. 1 is a schematic cross-sectional diagram of the microelectronic product at an early stage in its fabrication in accord with the general embodiment of the invention.

FIG. 1 shows a substrate 10 having a first region R1 laterally adjacent a second region R2. FIG. 1 also shows a blanket target layer 12 formed upon the substrate 10 and covering both the first region R1 and the second region R2. The blanket target layer 12 in turn has formed thereupon a patterned first mask layer 14 covering only the second region R2 and a blanket second mask layer 14' covering both the first region R1 and the second region R2. Finally, FIG. 1 shows a pair of patterned photoresist layers 15a and 15b formed upon the second mask layer 14', where the patterned photoresist layer 15a is formed over the first region R1 of the substrate 10 and the patterned photoresist layer 15b is formed over the second region R2 of the substrate 10.

Within the invention, the substrate 10 may be employed within a microelectronic product selected from the group including but not limited to integrated circuit products, ceramic substrate products and optoelectronic products. Although not specifically illustrated within FIG. 1, the substrate 10 may consist of a substrate alone as employed within the microelectronic product. In the alternative, the substrate 10 may comprise a substrate as employed within the microelectronic product, wherein the substrate has formed thereupon and/or thereover additional microelectronic layers as are conventional within the microelectronic product within which is employed the substrate. Similarly with the substrate alone as employed within the microelectronic product, such additional microelectronic layers may be formed from microelectronic materials selected from the group including but not limited to conductor materials, semiconductor materials and dielectric materials.

Within the invention, the blanket target layer 12 may be formed of a microelectronic material selected from the group including but not limited to conductor materials, semiconductor materials and dielectric materials. Typically, the blanket target layer 12 is formed to a uniform (i.e., single) thickness of from about 1000 to about 3000 angstroms.

Within the invention, each of the patterned first mask layer 14 and blanket second mask layer 14' is typically formed of a hard mask material. Typically the sum of the thicknesses of the patterned first mask layer 14 and the blanket second mask layer 14' is from about 200 to about 600 angstroms, with the patterned first mask layer 14 having a thickness of from about 20 to about 300 angstroms such as to provide the step height difference of the blanket second mask layer 14' between the first region R1 and the second region R2 of the substrate 10.

Within the present invention, each of the pair of patterned photoresist layers 15a and 15b is typically formed of the same linewidth (typically in a range of from about 0.1 to about 0.25 microns), although such is not necessarily required within the invention. Within the invention, the difference in thickness of the blanket second mask layer 14' within the first region R1 of the substrate 10 with respect to the patterned first mask layer 14 and the blanket second mask layer 14' within the second region R2 of the substrate 10 provides an incremental linewidth bias of a pair of patterned target layers formed from the blanket target layer 12 while employing a pair of patterned mask layers formed from the patterned first mask layer 14 and the blanket second mask layer 14' as a pair of etch mask layers. Within the invention in general, a thinner patterned mask layer (such as patterned mask layer derived from the blanket second mask layer 14' only, in comparison with a patterned mask layer derived from the patterned first mask layer 14 and the blanket second mask layer 14') will provide a greater negative linewidth bias between patterned mask layer linewidth and a patterned target layer linewidth formed employing the patterned mask layer as an etch mask layer.

FIG. 2 shows the results of further processing of the microelectronic product of FIG. 1.

FIG. 2 shows the results of sequentially etching the blanket second hard mask layer 14', the patterned first hard mask layer 14 and the blanket target layer 12 to form: (1) a first patterned layer stack within the first region R1 of the substrate 10; and (2) a second patterned layer stack within the second region R2 of the substrate 10. As is illustrated in FIG. 2, the foregoing etching is undertaken while employing an etching plasma 16. The first patterned layer stack comprises an etched patterned photoresist layer 15a' formed upon a patterned second mask layer 14a' in turn formed upon a patterned target layer 12a. The second patterned layer stack comprises an etched patterned photoresist layer 15b' formed upon a patterned second mask layer 14b' in turn formed upon a twice patterned first mask layer 14b finally in turn formed upon a patterned target layer 12b.

As is illustrated within FIG. 2, the patterned target layer 12a is formed with an enhanced negative linewidth bias with respect to the patterned photoresist layer 15a (in comparison with the patterned target layer 12b with respect to the patterned photoresist layer 15b), due to the decreased thickness of the patterned second mask layer 14a' in comparison with the patterned second mask layer 14b' plus the twice patterned first mask layer 14b.

FIG. 3 to FIG. 8 show a series of schematic cross-sectional diagrams illustrating the results of progressive stages of forming a CMOS device within a semiconductor product in accord with a more specific embodiment of the invention.

Figure 3:
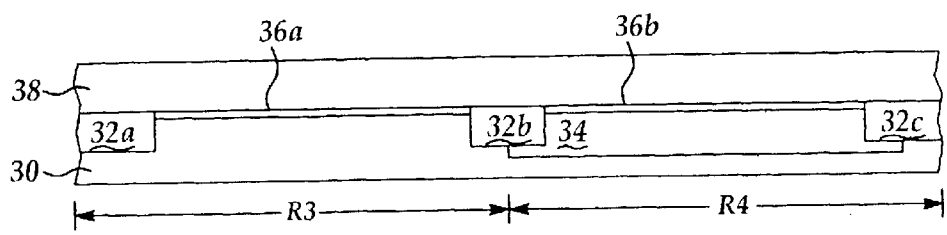
FIG. 3, FIG. 4, FIG. 5, FIG. 6, FIG. 7 and FIG. 8 show a series of schematic cross-sectional diagrams illustrating the results of progressive stages of fabricating a CMOS semiconductor product in accord with a more specific embodiment of the invention.

FIG. 3 shows a semiconductor substrate 30 having formed therein a series of isolation regions 32a, 32b and 32c which define a pair of active regions of the semiconductor substrate 30. The pair of active regions is formed within a first region R3 and a second region R4 of the semiconductor substrate 30. FIG. 3 also illustrates a counter-doped well 34 which encompasses the second region R4 of the semiconductor substrate 30 but not the first region R3. Within the more specific embodiment of the invention, the semiconductor substrate 30 may be of either dopant polarity, several dopant concentrations and various crystallographic orientations. The counter-doped well 34 is of polarity opposite the semiconductor substrate 30. In addition, the series of isolation regions 32a, 32b and 32c may be formed employing methods and materials as are conventional in the art of semiconductor product fabrication, to provide the series of isolation regions 32a, 32b and 32c as isolation regions including but not limited to shallow trench isolation regions and local oxidation of silicon (LOCOS) isolation regions.

FIG. 3 also shows formed upon the pair of active regions of the semiconductor substrate 30 a pair of gate dielectric layers 36a and 36b which are otherwise conventional in the art of CMOS device fabrication. Typically, each of the pair of gate dielectric layers 36a and 36b is formed to a thickness of from about 17 to about 80 angstroms.

Finally, FIG. 3 shows a blanket gate electrode material layer 38 formed upon exposed portions of the isolation regions 32a, 32b and 32c and the pair of gate dielectric layers 36a and 36b. The blanket gate electrode material layer 38 is typically formed of a polysilicon or polycide gate electrode material formed to a thickness of from about 1000 to about 3000 angstroms, although other materials and thicknesses may also be employed.

Figure 4:
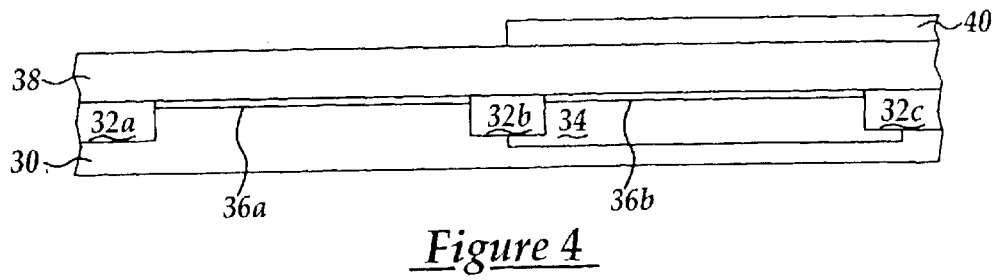

FIG. 4 shows the results of further processing of the semiconductor product of FIG. 3.

FIG. 4 shows the results of forming upon the blanket gate electrode material layer 38 over the second region R4 of the semiconductor substrate 30 but not over the first region R3 of the semiconductor substrate 30 a patterned first hard mask layer 40.

Within the invention, the patterned first hard mask layer 40 may be formed of hard mask materials as are conventional in the art of microelectronic fabrication, including but not limited to silicon oxide materials, silicon nitride materials and silicon oxynitride materials. Typically, the patterned first hard mask layer 40 is formed to a thickness of from about 20 to about 300 angstroms.

Figure 5:
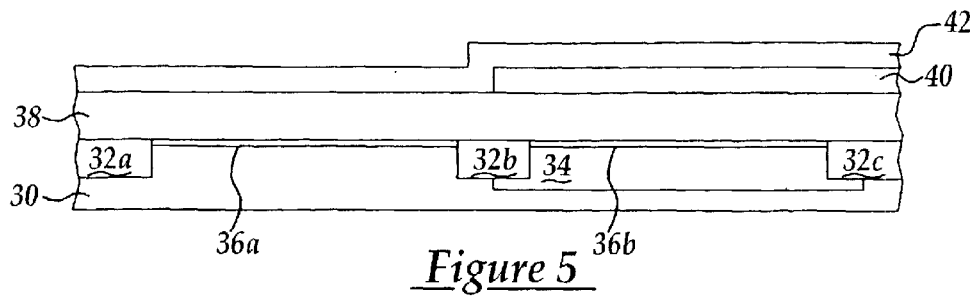

FIG. 5 shows the results of further processing of the semiconductor product of FIG. 4.

FIG. 5 shows a blanket second hard mask layer 42 formed upon exposed portions of the blanket gate electrode material layer 38 and the patterned first hard mask layer 40.

Within the invention, the blanket second hard mask layer 42 may be formed employing methods and materials analogous or identical to the methods and materials employed for forming the patterned first hard mask layer 40. Typically, the blanket second hard mask layer 40 is formed to a thickness of from about 200 to about 500 angstroms.

Figure 6:
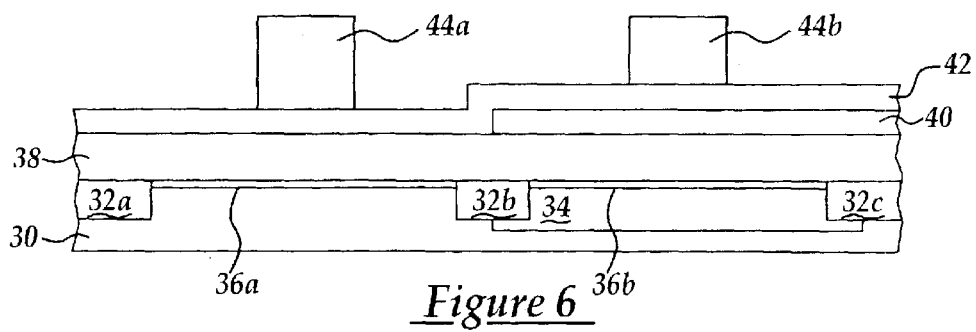

FIG. 6 shows the results of further processing of the semiconductor product of FIG. 5.

FIG. 6 shows the results of forming a pair of patterned photoresist layers 44a and 44b upon the blanket second hard mask layer 42, where the patterned photoresist layer 44a is formed over the first region R3 of the semiconductor substrate 30 and the patterned photoresist layer 44b is formed over the second region R4 of the semiconductor substrate 30.

Within the present invention, and analogously with the general embodiment of the invention, the pair of patterned photoresist layers 44a and 44b need not necessarily be of the same linewidth. Typically, each of the pair of patterned photoresist layers 44a and 44b is formed to a thickness of from about 3500 to about 8000 angstroms.

Figure 7:
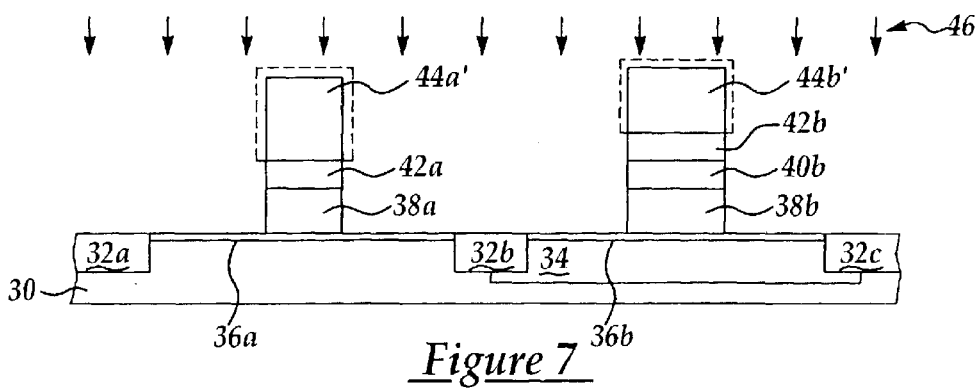

FIG. 7 shows the results of further processing of the semiconductor product of FIG. 6.

FIG. 7 shows the results of etching with an etching plasma 46 the blanket second hard mask layer 42, the patterned first hard mask layer 40 and the blanket gate electrode material layer 38 to form a pair of stack layers capped by a pair of etched patterned photoresist layers 44a' and 44b'. A first stack layer comprises the etched patterned photoresist layer 44a' formed upon a patterned second hardmask layer 42a in turn formed upon a first gate electrode 38a. A second stack layer comprises the etched patterned photoresist layer 44b' formed upon a patterned second hard mask layer 42b in turn formed upon a twice patterned first hard mask layer 40b in turn formed upon a second gate electrode 38b.

In accord with the general embodiment of the invention as illustrated within FIG. 2, the gate electrode 38a is formed with a greater negative linewidth bias with respect to the patterned photoresist layer 44a than the gate electrode 38b with respect to the patterned photoresist layer 44b, due to a diminished thickness of the patterned second hard mask layer 42a alone in comparison with a composite of the patterned second hard mask layer 42b and the twice patterned first hard mask layer 40b.

Within the more specific embodiment of the invention, the etching plasma 46 employs an etchant gas composition appropriate to the materials from which are formed the blanket second hard mask layer 32, the patterned first hard mask layer 40 and the blanket gate electrode material layer 38. Typically and preferably, the etching plasma will employ a fluorine containing etchant plasma for the former two layers and a chlorine containing etchant plasma for the latter layer.

Figure 8:
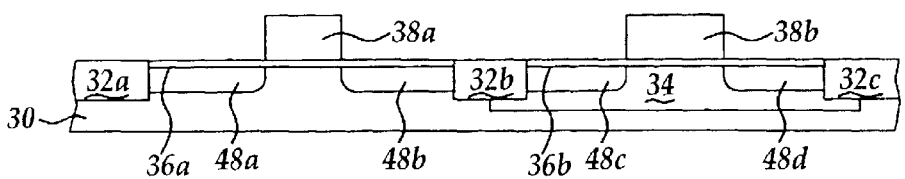

FIG. 8 shows the results of further processing of the semiconductor product of FIG. 7.

FIG. 8 shows the results of stripping the pair of etched patterned photoresist layers 44a' and 44b', the pair of patterned second hard mask layers 42a and 42b and the twice patterned first hard mask layer 40b from their respective gate electrodes 38a and 38b.

FIG. 8 also shows the results of forming into portions of the active regions of the semiconductor substrate 30 not covered by the pair of gate electrodes 38a and 38b a series of source/drain regions 48a, 48b, 48c and 48d.

The series of source/drain regions 48a, 48b, 48c and 48d may be formed employing methods and materials as are conventional in the art of semiconductor product fabrication.

FIG. 8 illustrates a CMOS device fabricated in accord with the present invention. The CMOS device has fabricated therein a pair of field effect transistor devices where a pair of linewidths of a pair of gate electrodes may be comparatively adjusted absent modification of a photomask. Instead, such comparative adjustment is made by adjusting comparative thicknesses of a pair of hard mask layers employed in forming the pair of gate electrodes. Relative adjustment of gate electrode linewidths within CMOS devices may be desirable to optimize CMOS device performance parameters, such as saturation currents.

EXAMPLES

Each of three semiconductor substrates had formed thereover a polysilicon gate electrode material layer formed to a thickness of about 2000 angstroms. Formed upon one of the polysilicon gate electrode material layers was a silicon oxynitride hard mask layer of thickness of about 300 angstroms. Formed upon a second of the polysilicon gate electrode material layers was a silicon oxynitride hard mask layer of thickness of about 320 angstroms. Formed upon a third of the polysilicon gate electrode material layers was a silicon oxynitride hard mask layer of thickness about 340 angstroms. Formed upon each of the hard mask layers was a series of patterned photoresist layers of linewidth about 0.15 microns and thickness about 4200 angstroms.

Each of the three hard mask layer/gate electrode material layer laminates was then etched while employing the series of patterned photoresist layers as etch mask layers, in conjunction with a fluorine containing etchant gas composition followed by a chlorine containing etchant gas composition.

Linewidths of the series of patterned polysilicon gate electrode material layers were then measured as a function of hard mask layer thickness. Results are reported in Table I.

TABLE I

| Hard Mask Thickness | Poly Linewidth |
| --- | --- |
| 300 | 0.150 |
| 320 | 0.151 |
| 340 | 0.154 |

The data in Table I clearly indicate a correlation of hard mask layer thickness and patterned gate electrode material layer linewidth, in accord with the present invention.

The preferred embodiments and examples of the invention are illustrative of the invention rather than limiting of the invention. Revisions and modifications may be made to structures and dimensions in accord with the preferred embodiments and examples of the invention while still providing a method in accord with the invention, further in accord with the accompanying claims.

What is claimed is:

1. A method for forming a pair of patterned layers comprising:
    providing a substrate having a first region laterally adjacent a second region;
    forming over the substrate a uniform thickness blanket target layer which covers the first region and the second region;
    forming over the uniform thickness blanket target layer a first patterned etch mask layer having a first thickness over the first region and a second patterned etch mask layer having a second thickness different from the first thickness over the second region; and
    etching the blanket target layer to form a first patterned target layer over the first region and a second patterned target layer over the second region, wherein the first thickness and the second thickness are adjusted such as to optimize a first linewidth of the first patterned target layer and a second linewidth of the second patterned target layer.

2. The method of claim 1 wherein the substrate is employed within a microelectronic product selected from the group consisting of integrated circuit products, ceramic substrate products and optoelectronic products.

3. The method of claim 1 wherein the blanket target layer is formed from a material selected from the group consisting of conductor materials, semiconductor materials and dielectric materials.

4. The method of claim 1 wherein the uniform thickness of the blanket target layer is from about 1000 to about 3000 angstroms.

5. The method of claim 1 wherein a difference between the first thickness and the second thickness is from about 20 to about 300 angstroms.

6. The method of claim 1 wherein the first patterned mask layer and the second patterned mask layer are formed of hard mask materials.

7. The method of claim 6 wherein an aggregate thickness of the first patterned mask layer and the second patterned mask layer is from about 200 to about 600 angstroms.

8. The method of claim 1 wherein each of the first patterned mask layer and the second patterned mask layer is formed with a linewidth of from about 0.1 to about 0.25 microns.

9. The method of claim 1 wherein each of the first patterned mask layer and the second patterned mask layer is formed of the same linewidth.

10. The method of claim 1 wherein the first patterned mask layer and the second patterned mask layer are formed of a laminate of photoresist mask materials and hard mask materials.

11. A method for forming a pair of gate electrodes comprising:
    providing a semiconductor substrate having a first region laterally adjacent a second region;
    forming over the semiconductor substrate a uniform thickness blanket gate electrode material layer which covers the first region and the second region;
    forming over the uniform thickness blanket gate electrode material layer a first patterned etch mask layer having a first thickness over the first region and a second patterned etch mask layer having a second thickness different from the first thickness over the second region; and
    etching the blanket gate electrode material layer to form a first gate electrode over the first region and a second gate electrode over the second region, wherein the first thickness and the second thickness are adjusted such as to optimize a first linewidth of the first gate electrode and a second linewidth of the second gate electrode.

12. The method of claim 11 wherein the pair of gate electrodes is formed within a complementary metal oxide semiconductor device.

13. The method of claim 11 wherein the blanket target layer is formed from a material selected from the group consisting of conductor materials, semiconductor materials and dielectric materials.

14. The method of claim 11 wherein the uniform thickness of the blanket target layer is from about 1000 to about 3000 angstroms.

15. The method of claim 11 wherein a difference between the first thickness and the second thickness is from about 20 to about 300 angstroms.

16. The method of claim 11 wherein the first patterned mask layer and the second patterned mask layer are formed of hard mask materials.

17. The method of claim 16 wherein an aggregate thickness of the first patterned mask layer and the second patterned mask layer is from about 200 to about 600 angstroms.

18. The method of claim 11 wherein each of the first patterned mask layer and the second patterned mask layer is formed with a linewidth of from about 0.1 to about 0.25 microns.

19. The method of claim 11 wherein each of the first patterned mask layer and the second patterned mask layer is formed of the same linewidth.

20. The method of claim 11 wherein the first patterned mask layer and the second patterned mask layer are formed of a laminate of photoresist mask materials and hard mask materials.

* * * * *